(12) United States Patent  (10) Patent No.: US 7,683,647 B1
Scharrer et al.  (45) Date of Patent: Mar. 23, 2010

(54) INSTRUMENT PER PIN TEST HEAD

(75) Inventors: Carl Scharrer, Keller, TX (US); Dave Rose, Lakewood, OH (US); Martin J. Rice, Sagamore Hills, OH (US); James A. Niemann, Aurora, OH (US); William F. Merkel, Aurora, OH (US); Warren Kumley, Solon, OH (US); William Knauer, Chagrin Falls, OH (US); Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 12/205,271

(22) Filed: Sep. 5, 2008

(51) Int. Cl.
*G01R 31/02* (2006.01)
*G01R 31/26* (2006.01)

(52) U.S. Cl. .................. 324/754; 324/758; 324/761

(58) Field of Classification Search .......... 324/754–765
See application file for complete search history.

(56) References Cited

U.S. PATENT DOCUMENTS

| 6,791,344 B2 * | 9/2004 | Cook et al. ................. 324/754 |
| 6,838,892 B2 * | 1/2005 | Suzuki ....................... 324/754 |
| 6,873,167 B2 * | 3/2005 | Goto et al. .................. 324/754 |
| 7,262,626 B2 * | 8/2007 | Iwasaki ...................... 324/765 |
| 2007/0103176 A1 * | 5/2007 | Mostarshed et al. ......... 324/754 |
| 2008/0315862 A1 * | 12/2008 | Daniel ....................... 324/73.1 |

* cited by examiner

*Primary Examiner*—Ha Tran T Nguyen
*Assistant Examiner*—Emily Y Chan
(74) *Attorney, Agent, or Firm*—Pearne & Gordon LLP

(57) ABSTRACT

A test head for testing a DUT includes a probe card having a plurality of DUT probes, the probes being in contact with the DUT during the testing; an instrument carrier, the instrument carrier being located above the DUT during the testing; and a SMU mounted on the carrier for each of the probes, each SMU being operably connectable to a respective probe, wherein the carrier is moved with respect to the probe card to permit replacement of the probe card.

8 Claims, 2 Drawing Sheets

INSTRUMENT PER PIN TEST HEAD

BACKGROUND OF THE INVENTION

The present invention relates to electrical measurements and, in particular, to test equipment with many test probes.

In the testing of semiconductor devices and electronic products, it is common to use test heads having many test probes. Such test heads may have ten or more probes, for example, 56 may be used. To use the probes, measurement instruments need be connected to the probes.

The use of such numbers of probes complicates the connection, configuration and operation of the test instruments in combination with the probes.

SUMMARY OF THE INVENTION

A test head for testing a DUT includes a probe card having a plurality of DUT probes, the probes being in contact with the DUT during the testing; an instrument carrier, the instrument carrier being located above the DUT during the testing; and a SMU mounted on the carrier for each of the probes, each SMU being operably connectable to a respective probe, wherein the carrier is movable with respect to the probe card to permit replacement of the probe card.

DESCRIPTION OF THE PREFERRED EMBODIMENTS

Figure 1:
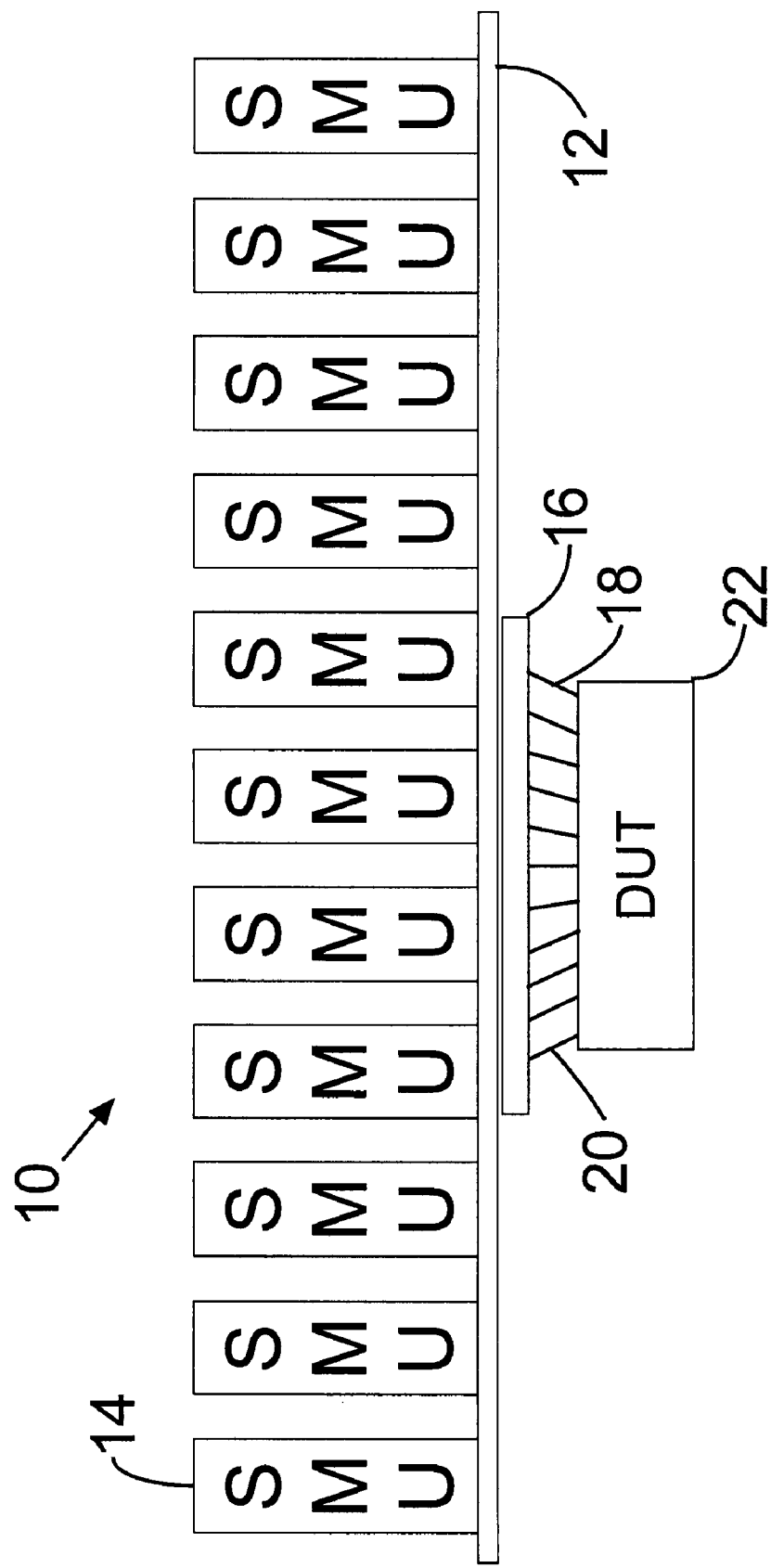
FIG. 1 is a schematic diagram of an example of a test head according to an aspect of the invention.

Referring to FIG. 1, a test head 10 includes an instrument carrier 12 and multiple source measure units (SMUs) 14 mounted on the instrument carrier 12 and a probe card 16 with attached probes 18, 20. The SMUs 14 are primarily DC devices that can source voltage and measure current or vice versa. The SMUs 14 may, for example, be under the control on an unshown computer, or one or more of the SMUs 14 may be provided with sufficient intelligence to control itself and other SMUs. The probe card 16 is replaceable by moving the instrument carrier 12 away from the probe card 16 or vice versa. For example, the probe card 16 may sit on its own unshown carrier and when the instrument carrier 12 is moved away from the probe card 16 or vice versa, the probe card 16 may be removed for replacement. The movement of the instrument carrier 12 and/or the probe card 16 may be, for example, by an unshown motorized manipulator that can raise, lower and otherwise manipulate the position of the carrier 12 with respect to the probe card 16. For clarity, only the probes 18, 20 are shown, but each of the SMUs 14 actually have at least one associated probe.

In operation, the probes 18, 20 are moved into contact with a device under test (DUT) 22. This may be accomplished, for example, by moving the test head 10 toward the DUT 22 or vice versa with another unshown motorized manipulator. Under computerized control, the desired SMUs 14 can be instructed to perform desired tests on the DUT 22 through electrical connections between the SMUs 14 and respective probes.

Figure 2:
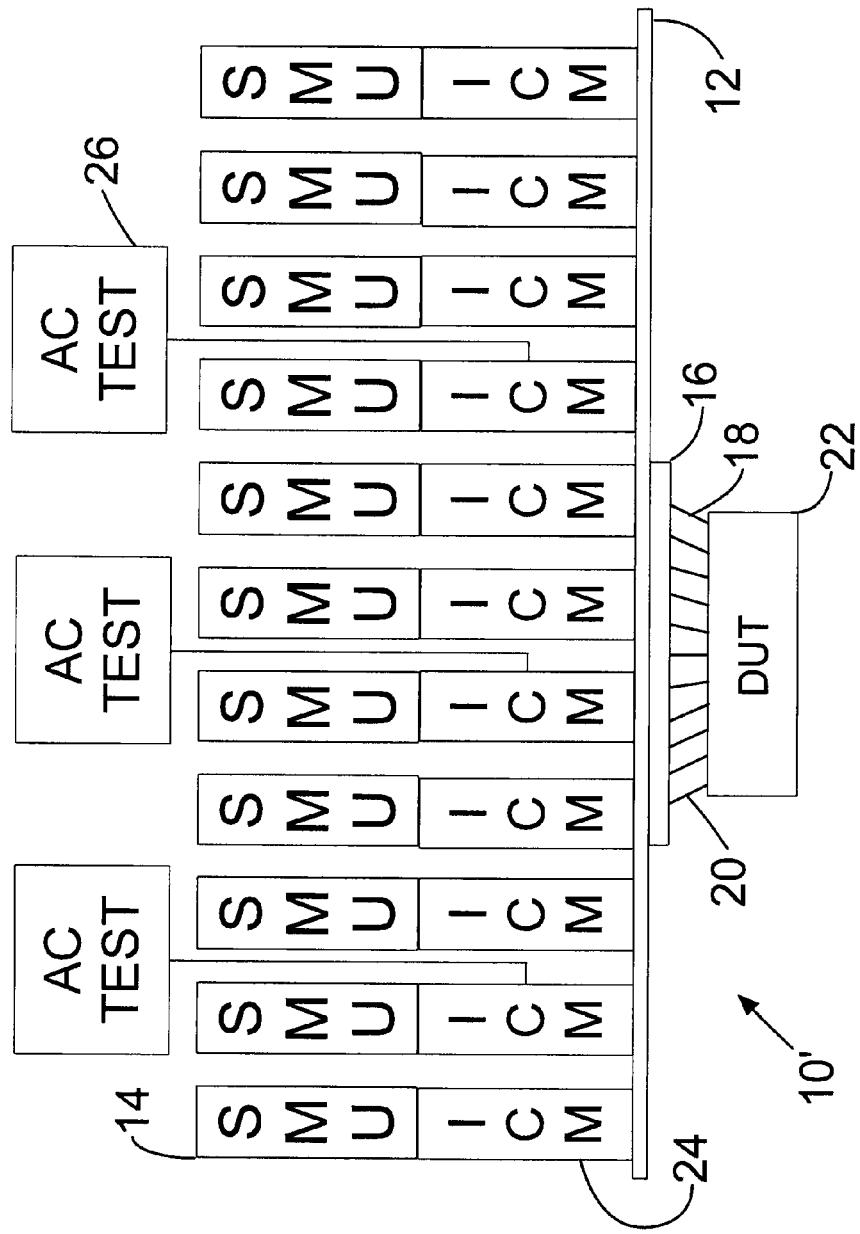
FIG. 2 is a schematic diagram of another example of a test head according to the invention according to another aspect of the invention.

Referring to FIG. 2, a test head 10' is similar to the test head 10 except that an interconnect module (ICM) 24 is located between each SMU 14 and the respective probe. The ICMs 24 provide an option of connecting other test instruments to the probes for making additional tests. For example, an ICM 24 may provide selectable connections to AC test instruments 26. For example, the AC test instruments may be low frequency, RF or pulse test instruments. The AC test instruments 26 may be mounted on the carrier 12 or cabled remotely to the ICMs 24. The ICMs 24 may, for example, be computer-controlled selector switches, DC-AC hybrid splitters, or combinations of both.

The test heads 10, 10' will typically have at least 10 SMUs 14 and 56 of the SMUs 14 may, for example, be desirable. With such densities, it may be desirable to mount the SMUs 14 (and ICMs 24) radially about a central point on the instrument carrier 12 corresponding to the location of the probe card 16. This can minimize connection lengths between the SMUs 14 and DUT 22.

The SMUs 14 can also be used for digital pattern testing of the DUT 22. For example, eight of the SMUs 14 can be used to apply an 8-bit pattern to the DUT 22 or to read an 8-bit pattern from the DUT 22. Sixteen of the SMUs 14 can apply an 8-bit pattern and read a resulting 8-bit pattern, and so on up to the total number of SMUs 14.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A test head for testing a DUT, said test head comprising:
   a probe card having a plurality of DUT probes, said probes being in contact with said DUT during said testing;
   an instrument carrier, said instrument carrier being located above said DUT during said testing; and
   a plurality of SMUs mounted on said carrier for the plurality of probes, each SMU being operably connectable to a respective probe, wherein said carrier is configured to be movable with respect to the probe card to permit replacement of said probe card.

2. A test head according to claim 1, further comprising an interconnect module between respective SMUs and probes, said interconnect modules selectively connecting additional test instruments to desired probes.

3. A test head according to claim 2, wherein said additional test instruments include AC test instruments.

4. A test head according to claim 1, wherein said SMUs are configured to be operated to provide digital patterns to said DUT.

5. A test head according to claim 4, wherein at least an 8-bit pattern is provided by said SMUs to said DUT.

6. A test head according to claim 1, wherein said SMUs are configured to be operated to read digital patterns from said DUT.

7. A test head according to claim 6, wherein at least an 8-bit data pattern is read by said SMUs from said DUT.

8. A test head according to claim 1, including at least 10 SMUs.

* * * * *